US 6,596,195 B2

(12) United States Patent
Srivastava et al.

(10) Patent No.: US 6,596,195 B2
(45) Date of Patent: Jul. 22, 2003

(54) BROAD-SPECTRUM TERBIUM-CONTAINING GARNET PHOSPHORS AND WHITE-LIGHT SOURCES INCORPORATING THE SAME

(75) Inventors: Alok Mani Srivastava, Niskayuna, NY (US); Anant Achyut Setlur, Niskayuna, NY (US); Holly Ann Comanzo, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 131 days.

(21) Appl. No.: 09/681,522

(22) Filed: Jun. 1, 2001

(65) Prior Publication Data
US 2002/0195587 A1 Dec. 26, 2002

(51) Int. Cl.⁷ .......................... H05B 33/14; C09K 11/80; C09K 11/78; H01L 33/00
(52) U.S. Cl. ................ 252/301.4 R; 313/501; 313/503; 257/98
(58) Field of Search .................. 252/301.4 R; 313/501, 313/503; 257/98

(56) References Cited

U.S. PATENT DOCUMENTS

| 4,026,816 A | 5/1977 | Ranby et al. |
| 4,550,256 A | 10/1985 | Berkstresser et al. |
| 4,604,549 A | 8/1986 | Matsuda et al. |
| 4,631,144 A | 12/1986 | Beers et al. |
| 5,777,350 A | 7/1998 | Nakamura et al. |
| 5,998,925 A | 12/1999 | Shimizu et al. |
| 6,013,199 A | * 1/2000 | McFarland et al. ... 252/301.4 R |

FOREIGN PATENT DOCUMENTS

| DE | 19943126 | * 1/2001 |
| EP | 0142931 | 12/1986 |
| JP | 74(49)-3629 B | * 1/1974 |
| WO | 0108452 | 2/2001 |
| WO | 0108453 | 2/2001 |
| WO | 0193341 | * 12/2001 |

OTHER PUBLICATIONS

Translation for WO 01/08452.*
Translation for WO 01/08453.*

* cited by examiner

Primary Examiner—C. Melissa Koslow
(74) Attorney, Agent, or Firm—Toan P. Vo; Noreen C. Johnson (57) ABSTRACT

A rare earth-activated terbium-containing garnet phosphor is capable of absorbing radiation in the range from near UV to blue and emitting a broad spectrum of visible light in the range from about 490 nm to about 770 nm. The emission of the phosphor under an excitation at 450 nm exhibits a peak in the range of maximum sensitivity of the human eye. A light source combining a UV/blue LED and this phosphor can provide a white light that is on or near the Planckian locus and may be useful for general illumination.

80 Claims, 4 Drawing Sheets

BROAD-SPECTRUM TERBIUM-CONTAINING GARNET PHOSPHORS AND WHITE-LIGHT SOURCES INCORPORATING THE SAME

BACKGROUND OF INVENTION

The present invention relates to broad-spectrum visible light-emitting phosphors having a garnet structure activated with rare-earth metal ions. In particular, the present invention relates to a terbium aluminum oxide garnet phosphor activated with cerium that emits yellow light under blue-light excitation. The present invention also relates to white light sources using these phosphors.

A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range. Well-known phosphors have been used in mercury vapor discharge lamps to convert the ultraviolet ("UV") radiation emitted by the excited mercury vapor to visible light. Other phosphors are capable of emitting visible light upon being excited by electrons (used in cathode ray tubes) or x rays (for example, scintillators in x-ray detection systems).

The efficiency of a lighting device that uses a phosphor increases as the difference between the wavelength of the exciting radiation and that of the emitted radiation narrows. Therefore, in the quest for improving efficiency of white light sources, effort has been dedicated to finding a source of stimulating radiation that has wavelengths longer than that of UV radiation and phosphors that respond to those wavelengths. Recent advances in light-emitting diode ("LED") technology have brought efficient LEDs emitting in the near UV-to-blue range. The term "near UV" as used herein means UV radiation having wavelengths in the range from about 315 nm to about 400 nm. These LEDs emitting radiation in the near UV-to-blue range will be hereinafter called "UV/blue LEDs." As used herein, a UV/blue LED may emit radiation having wavelengths in the near UV range, in the blue light range, or in a broad range from near UV to blue. It would be an advance to the technology of lighting to provide a range of phosphors that can be stimulated by the radiation emitted from these UV/blue LEDs radiation sources to allow for a flexibility in the use of phosphors for generating various color LEDs. Such phosphors when combined with the emission from the UV/blue LEDs can provide efficient and long lasting lighting devices that consume little power.

Many near UV/blue LEDs based on combinations of nitrides of indium, aluminum, and gallium have recently appeared. For example, U.S. Pat. No. 5,777,350 disclosed LEDs comprising multiple layers of indium and gallium nitrides and p- and n-type AlGaN, which emit in the wavelength range of about 380 nm to about 420 nm. The active layer of such a LED may be doped with other materials to shift the LED peak emission within the UV-to-blue wavelength range. A LED having a peak emission in the blue light wavelengths was combined with a coating of a yellow light-emitting yttrium aluminum garnet phosphor activated with cerium ("YAG:Ce") to produce white light is disclosed in U.S. Pat. No. 5,998,925. Although a substantial portion of the need for white light devices may be filled by LED-based devices, the ability to combine a UV/blue LED with a phosphor has been limited because YAG:Ce has been the only known yellow light-emitting phosphor that is excitable by radiation in the blue range.

Therefore, there is a need to provide new phosphors that are excitable in the near UV-to-blue range and emit in the visible range. It is also desirable to provide novel phosphors that emit light in a broad wavelength range from blue green to red so that they may be combined with UV/blue LEDs to produce white light of high efficiency and/or high color rendering index ("CRI").

SUMMARY OF INVENTION

The present invention provides phosphors that are excitable by radiation having wavelengths in the near UV-to-blue range (from about 315 nm to about 480 nm) to emit efficiently a visible light in a broad range of wavelengths from about 490 nm to about 770 nm having an emission peak in the green-to-yellow wavelength range. In general, the phosphors of the present invention are oxide solids containing at least terbium and at least one element selected from the group consisting of aluminum, gallium, and indium and are activated with at least one rare-earth metal ion selected from the group consisting of cerium, praseodymium, neodymium, samarium, europium, gadolinium, dysprosium, holmium, erbium, thulium, ytterbium, and lutetium. Terbium may be substituted partially by at least one rare-earth metal selected from the group consisting of yttrium, lanthanum, gadolinium, samarium, and lutetium. The phosphors of the present invention have a garnet structure and a general formula of $$(Tb_{1-x-y}A_xRE_y)_3D_zO_{12}$$

where A is a member selected from the group consisting of Y, La, Gd, and Sm;

RE is a member selected from the group consisting of Ce, Pr, Nd, Sm, Eu, Gd, Dy, Ho, Er, Tm, Yb, Lu, and combinations thereof; D is a member selected from the group consisting of Al, Ga, In, and combinations thereof; x is in the range from 0 to about 0.5, and y is in the range from about 0.0005 to about 0.2, and z is in the range from about 4 to 5. In one aspect of the present invention, 4<z<5.

According to another aspect of the invention, a method for producing a rare earth-activated terbium-containing garnet phosphor is provided and comprises the steps of: (1) providing stoichiometric amounts of oxygen-containing compounds of terbium, oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In; (2) mixing together the oxygen-containing compounds to form a mixture; (3) optionally adding at least one fluxing compound selected from the group consisting of fluorides of Tb, Al, Ga, In, Y, La, Gd, Ce, Pr, Nd, Sm, Eu, Gd, Dy, Ho, Er, Tm, Yb, and Lu in the mixture in a quantity sufficient to act as a flux; and (4) firing the mixture in a reducing atmosphere at a temperature and for a time sufficient to convert the mixture to a rare earth-activated terbium-containing garnet phosphor.

In another aspect of the invention, a first solution of stoichiometric amounts of oxygen-containing compounds of terbium; at least one other rare-earth metal selected from the group consisting of Ce, Pr, Nd, Sm, Eu, Gd, Dy, Ho, Er, Tm, Yb, and Lu; and at least one metal selected from the group consisting of Al, Ga, and In is precipitated in a basic solution to obtain a mixture of hydroxides of the metals. The mixture of precipitated hydroxides is calcined in an oxidizing atmosphere. The calcined material is further thoroughly mixed, and then fired in a reducing atmosphere at a temperature and for a time sufficient to convert the calcined mixture to rare earth-activated terbium-containing garnet phosphor. In one embodiment of this process, a fluoride of at least one metal selected from the group consisting of Tb, Al, Ga, In, Y, La, Ga, Sm, Ce, Pr, Nd, Eu, Dy, Ho, Er, Tm, Yb, and Lu into said first solution.

In still another aspect of the present invention, a light source emitting white light is provided and comprises a UV/blue LED, an amount of a rare earth-activated terbium-containing garnet phosphor having the formula $(Tb_{1-x-y}A_xRE_y)_3D_zO_{12}$ wherein A, RE, D, x, y, and z are defined above. The phosphor is disposed adjacent to the UV/blue LED such that the phosphor absorbs at least a portion of the radiation emitted by the UV/blue LED to a visible light. The light emitted by the phosphor and a portion of the radiation emitted by the UV/blue LED are combined to produce a white light.

DETAILED DESCRIPTION

The present invention provides a phosphor that is efficiently excitable by radiation having wavelengths in the near UV-to-blue range and efficiently emits light in the visible range having a broad spectrum from blue to red (from about 490 nm to about 770 nm). The phosphor has an emission peak in the green to yellow range (from about 540 nm to about 600 nm) which includes the range of maximum sensitivity of the human eye. The phosphor of the present invention is a rare earth-activated terbium-containing garnet having a general formula $(Tb_{1-x-y}A_xRE_y)_aD_zO_{12}$ (hereinafter also called "TAG:Ce", where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; A is chosen such that A is different from RE; D is a member selected from the group consisting of Al, Ga, and In; a is in the range from about 2.8 to and including 3; x is in the range from 0 to about 0.5, preferably from 0 to about 0.3, more preferably from 0 to about 0.2; and y is in the range from about 0.0005 to about 0.2, preferably from about 0.005 to about 0.1, more preferably from about 0.005 to about 0.07; and z is in the range from about 4 to about 5, preferably from about 4.5 to 5, more preferably from about 4.6 to less than about 5. In one preferred embodiment, the phosphor is terbium aluminum garnet activated with cerium having the formula $(Tb_{1-y}Ce_y)_aAl_{4.9}O_{12}$ where y takes the values as defined above and a is in the range from about 2.8 to 3.

In one preferred embodiment, the phosphor is terbium aluminum garnet activated with cerium having the formula $(Tb_{1-y}Ce_y)_aAl_{4.9}O_{12}$ where y takes the values as defined above and a is in the range from about 2.8 to 3.

In another preferred embodiment, aluminum is partially substituted with gallium, indium, or a combination thereof. In this case, the phosphor has the formula of $(Tb_{1-y}Ce_y)_3(Al_{1-r-s}Ga_rIn_s)_zO_{12}$ where y and z are defined above and $0 \leq r \leq 0.5$ when $0 < s < 0.5$ and $r+s < 1$, or $0 < r \leq 0.5$ when $0 \leq s \leq 0.5$ and $r+s < 1$. Preferably, r is in a range from about 0.005 to about 0.3 and more preferably from about 0.05 to about 0.2; and s is preferably in a range from about 0.005 to about 0.3 and more preferably from about 0.05 to about 0.2.

In another preferred embodiment, terbium is partially substituted by one of Y, Gd, Sm, or a combination thereof and aluminum is not substituted. In this case, the phosphor has the formula of $(Tb_{1-y-u-v-w}Ce_yY_uGd_vSm_w)_3Al_zO_{12}$ where y and z are defined above, $0 \leq u, v, w \leq 0.5$, and $0.0005 \leq y+u+v+w < 1$.

Each of u, v, and w is preferably in a range from about 0.005 to about 0.3 and more preferably from about 0.005 to about 0.1.

In still another preferred embodiment, the phosphor has the formula of $(Tb_{1-x-y}A_xCe_y)_3Al_zO_{12}$, where A is Y or Gd, $0 < x \leq 0.5$, and y and z are defined above.

A phosphor of the present invention is produced by a method comprising the steps of: (1) providing stoichiometric amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In; (2) mixing together the oxygen-containing compounds to form a mixture; and (3) firing the mixture in a reducing atmosphere at a temperature and for a time sufficient to convert the mixture to a rare earth-activated terbium-containing garnet phosphor.

In another aspect of the present invention, an amount of fluoride of at least one metal selected from the group consisting of terbium, aluminum, gallium, and indium is added as a fluxing agent into the mixture of the oxygen-containing compounds before or during the step of mixing. A quantity of a fluoride compound of less than about 20, preferably less than about 10, percent by weight of the total weight of the mixture is adequate for fluxing purposes.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired under a reducing atmosphere at a temperature from about 900° C. to about 1700° C., preferably from about 1000° C. to about 1600° C., more preferably from about 1200° C. to about 1500° C. for a time sufficient to convert all of the mixture to the final garnet composition. The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. Alternatively, the crucible containing the mixture may be packed in a second closed crucible containing high-purity carbon particles and fired in air so that the carbon particles react with the oxygen present in air, thereby, generating carbon monoxide that is needed to provide the reducing atmosphere.

EXAMPLE

The following quantities of oxides of terbium, cerium, and aluminum and aluminum fluoride were dry blended thoroughly.

$Tb_4O_7$:6.805 g $CeO_2$:0.194 g $Al_2O_3$:3.062 g $AlF_3$:0.105 g

Figure 1:
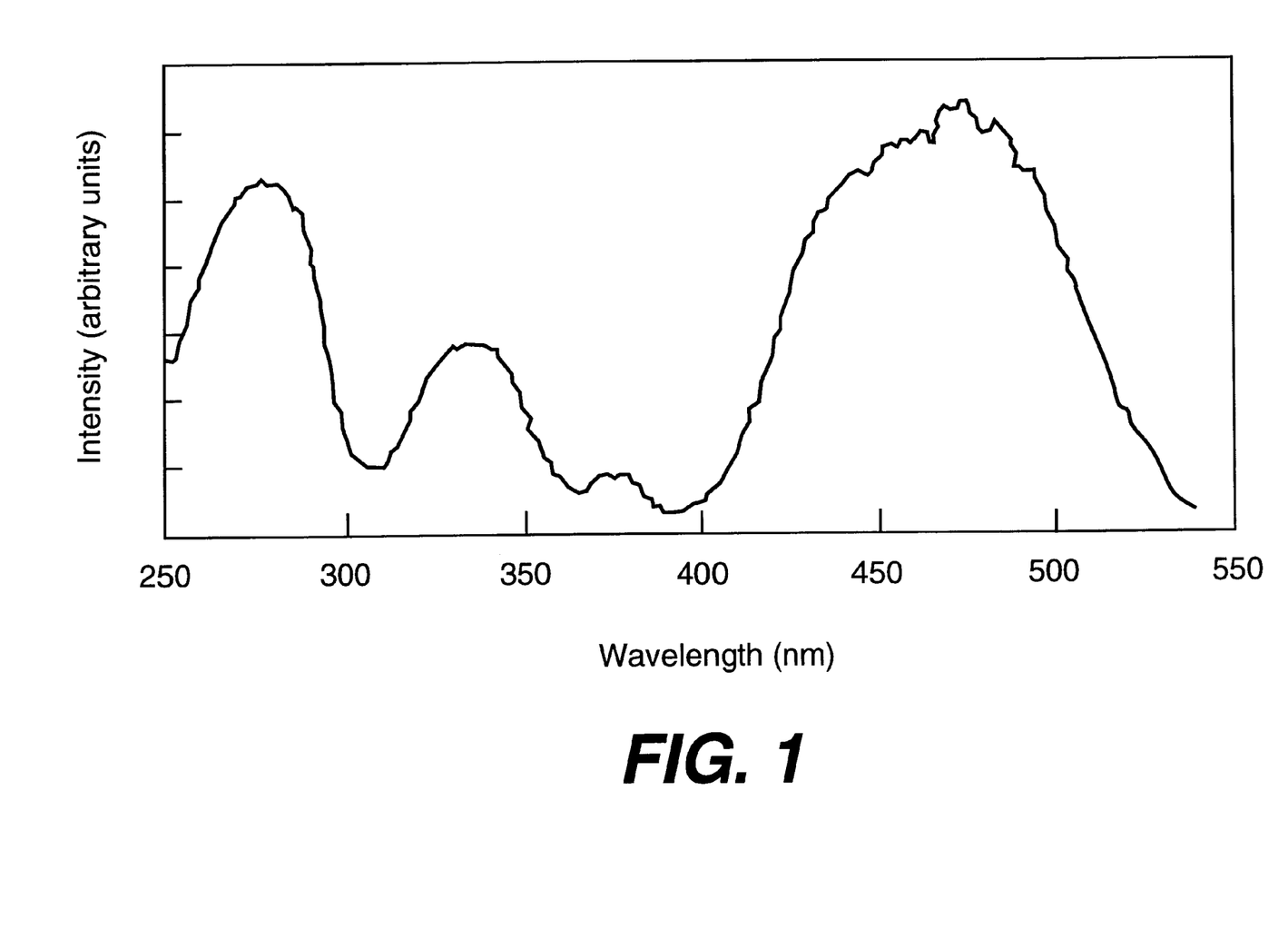
FIG. 1 shows the room-temperature excitation spectrum of a phosphor of the present invention having the composition $(Tb_{0.97}Ce_{0.03})_3Al_{4.9}O_{12}$.
Figure 2:
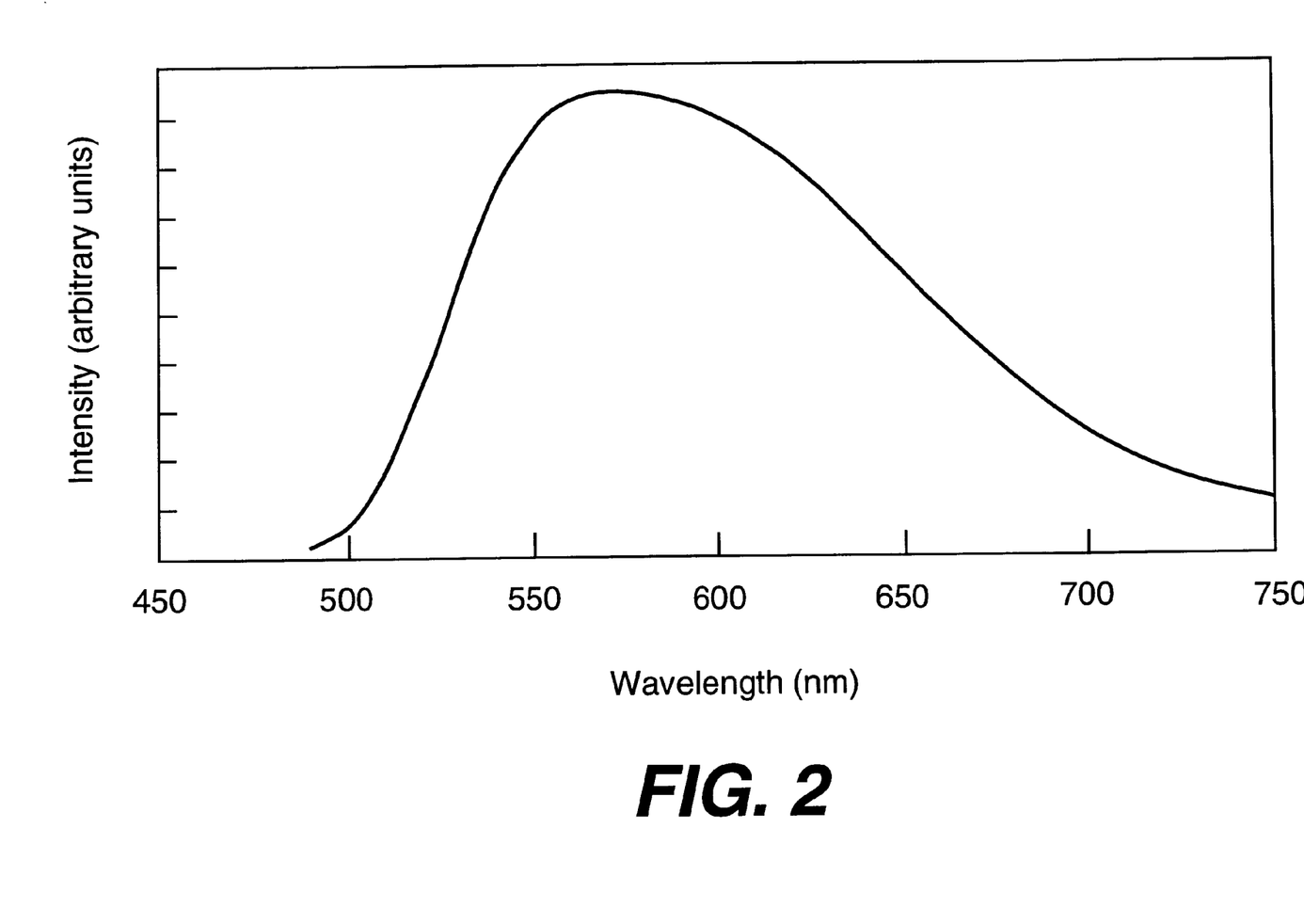
FIG. 2 shows the room-temperature emission spectrum of the $(Tb_{0.97}Ce_{0.03})_3Al_{4.9}O_{12}$ phosphor.

This mixture was placed in a first crucible which is placed inside a second closed crucible containing particles of a coconut charcoal were packed with the mixture, and the combined mixture was fired at 1450° C. for 5 hours in a reducing atmosphere which is a combination of 10% (by volume) $H_2$ in nitrogen and gas generated by the reaction of coconut charcoal in a box furnace. At the end of 5 hours, the solid was cooled under the same flow of $H_2/N_2$ mixture. The final phosphor has the composition of $(Tb_{0.97}Ce_{0.03})_3Al_{4.9}O_{12}$, as determined by elemental analysis. Excitation spectrum and emission spectrum under 450-nm excitation of the phosphor were measured and shown in FIGS. 1 and 2, respectively. The phosphor of the present invention shows a broad spectrum of emission in the visible range from about 490 nm to about 770 nm. Thus, the emission covers the range from blue-green to red light. Therefore, a combination of this emission spectrum and blue light emitted from, for example, a LED emitting blue light should provide a white light.

One or more of the starting materials for the phosphor synthesis may be oxygen-containing compounds other than oxides, such as nitrates, sulfates, acetates, citrates, or chlorates. For example, amounts of $Tb_4O_7$, $Al(NO_3)_3 \cdot 9H_2O$, $Ce(NO_3)_3 \cdot 6H_2O$ and $AlF_3$ are blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution containing Tb, Ce, and Al while stirring to precipitate a mixture of hydroxides of Tb, Ce, and Al. An organic base; such as methanolamine, ethanolamine, propanolamine, dimethanolamine, diethanolamine, dipropanolamine, trimethanolamine, triethanolamine, or tripropanolamine; may be used in place of ammonium hydroxide. The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. A calcination time of less than about 10 hours is adequate. The dried precipitate may also be calcined in an oxidizing atmosphere selected from the group consisting of oxygen, air, and a mixture thereof with an inert gas selected from the group consisting of nitrogen, helium, neon, argon, krypton, and xenon. The calcination may be carried out at a constant temperature. Alternatively, the calcination temperature may be ramped from ambient to and held at the final temperature for the duration of the calcination. The calcined material is similarly fired, as in the dry method described above, at a temperature in the range from about 900° C. to about 1700° C., preferably from about 1000° C. to about 1600° C., and more preferably from about 1200° C. to about 1600° C. for a sufficient time under a reducing atmosphere such as $H_2$, CO, or a mixture of one of theses gases with an inert gas, or an atmosphere generated by a reaction between a coconut charcoal and the products of the decomposition of the oxygen-containing compounds to covert all of the calcined material to the desired phosphor composition.

Alternatively, instead of $AlF_3$, a fluoride of at least one of Tb and Ce may be added to the other oxygen-containing compounds in the acid solution. When the desired phosphor comprises one or more other rare-earth elements and/or one element selected from the group consisting of Ga, In, and combination thereof, a fluoride of at least one of these elements may be added to the other oxygen-containing compounds in the acid solution. For example, such a fluoride can be a fluoride of Gd, In, Y, La, Sm, Pr, Nd, Eu, Dy, Ho, Er, Tm, Yb, or Lu.

In another aspect of the present invention, the phosphors have higher quantum efficiency when their compositions are non-stoichiometric. Table 1 below shows that high quantum efficiency is achieved for phosphors having a general formula of $Tb_aAl_zO_{12}:Ce^{3+}$, where both the ratio a/z is different from 0.6 and z is less than 5. The relative quantum efficiency reported in Table 1 is compared against a standard cerium-activated yittrium aluminate garnet phosphor.

TABLE 1

| Sample Batch No. | a/z | z | Batch Size (g) | Firing Condition | Relative Quantum Efficiency (%) |
|---|---|---|---|---|---|
| D0213 | 0.594 | 4.9 | 150 | Packed in carbon | 98 |
| D0207 | 0.594 | 4.9 | 100 | Packed in carbon | 93 |
| D0208 | 0.594 | 4.9 | 100 | Fired in $H_2$ | 97 |
| D0215 | 0.594 | 4.9 | 250 | Packed in carbon | 88 |
| D0220 | 0.582 | 5 | 250 | Packed in carbon | 88 |
| D0225 | 0.613 | 4.75 | 250 | Fired twice in carbon pack | 92 |

White Light-Emitting Device

Incorporation of a rare earth-activated terbium-containing phosphor of the present invention in a device comprising a UV/blue LED emitting near-UV-to-blue light in the range of about 315 nm to about 480 nm should provide a white light source that uses electrical power efficiently. In some embodiments, the LED can desirably be chosen to emit in the range from about 400 nm to about 480 nm. The white light source may be fabricated to provide a point source device by using one blue LED or a large-area lighting device by using a plurality of blue LEDs.

Figure 3:
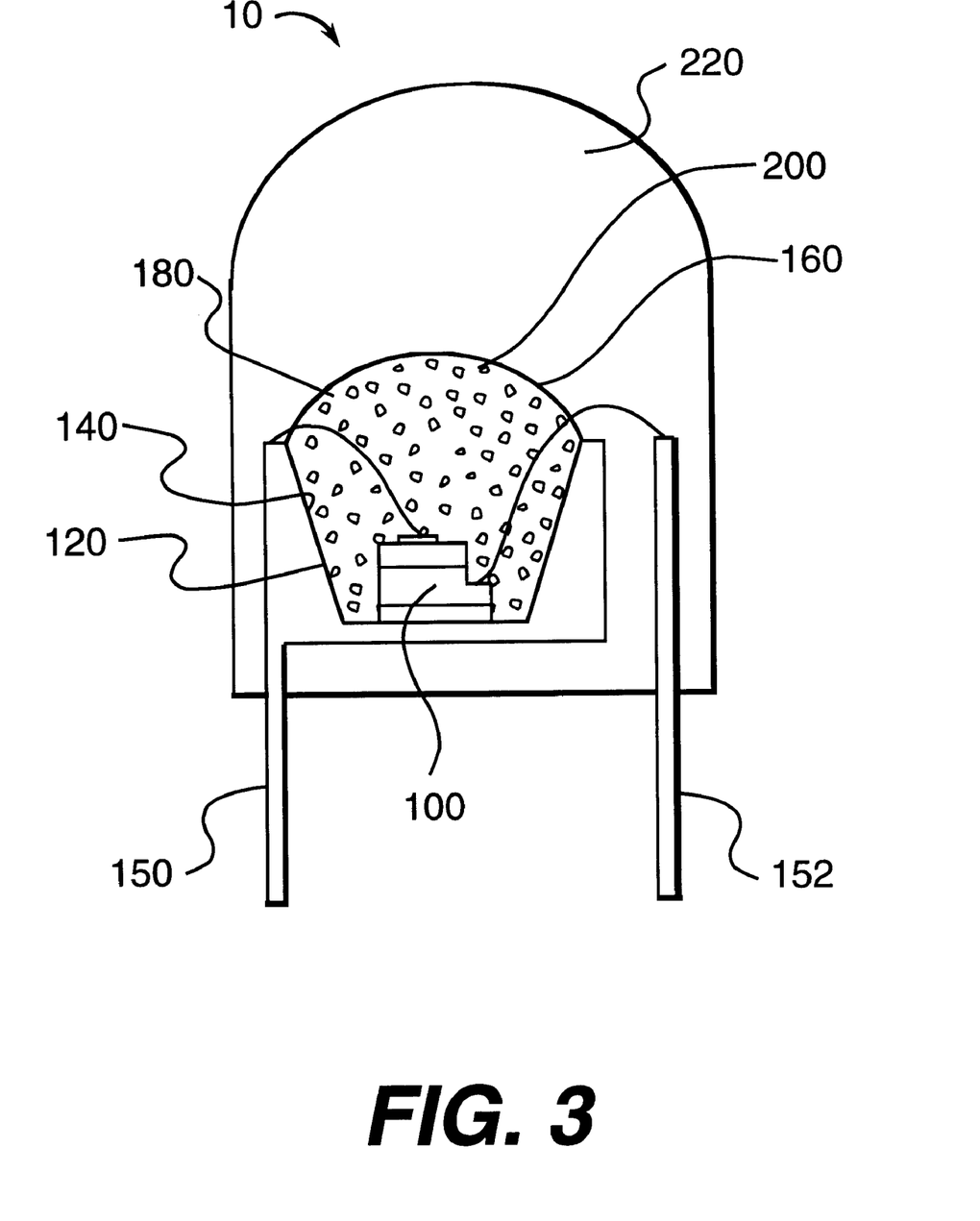
FIG. 3 shows an embodiment of a white-light source using a phosphor of the present invention.

In one embodiment of the present invention as shown in FIG. 3, a white light source 10 comprises a LED 100 emitting blue light in the range of about 400 nm to about 480 nm and a phosphor of the present invention. The LED 100 is mounted in a cup 120 having a reflective surface 140 adjacent LED 100. Blue LEDs suitable for white light-emitting devices are InGaN semiconductor-based LEDs such as those of U.S. Pat. No. 5,777,350 mentioned above, which is incorporated herein by reference. Other UV/blue LEDs also may be used, such as LEDs based on GaN semiconductor doped with various metals to provide a large band gap. Electrical leads 150 and 152 are provided to supply electrical power to the LED 100. A transparent casting 160 comprising an epoxy, a silicone, or glass 180 in which there are dispersed substantially uniformly particles 200 of a phosphor of the present invention. Alternatively, the phosphor particles may be applied on the LED 100 or dispersed in only a portion of the transparent casting 160. Other transparent polymers also may be used to form the transparent casting. In addition, particles of a light scattering material, such as $TiO_2$ or $Al_2O_3$, may be included in the transparent casting among the phosphor particles to improve the uniformity of the light emitted from the light source 10. The composition of the InGaN active layer of the LED and the quantity of the phosphor applied in the casting may be chosen such that a portion of the blue light emitted by the LED that is not absorbed by the phosphor and the broad-spectrum light emitted by the phosphor are combined to provide the white light source 10 of a desired color temperature and CRI.

Figure 4:
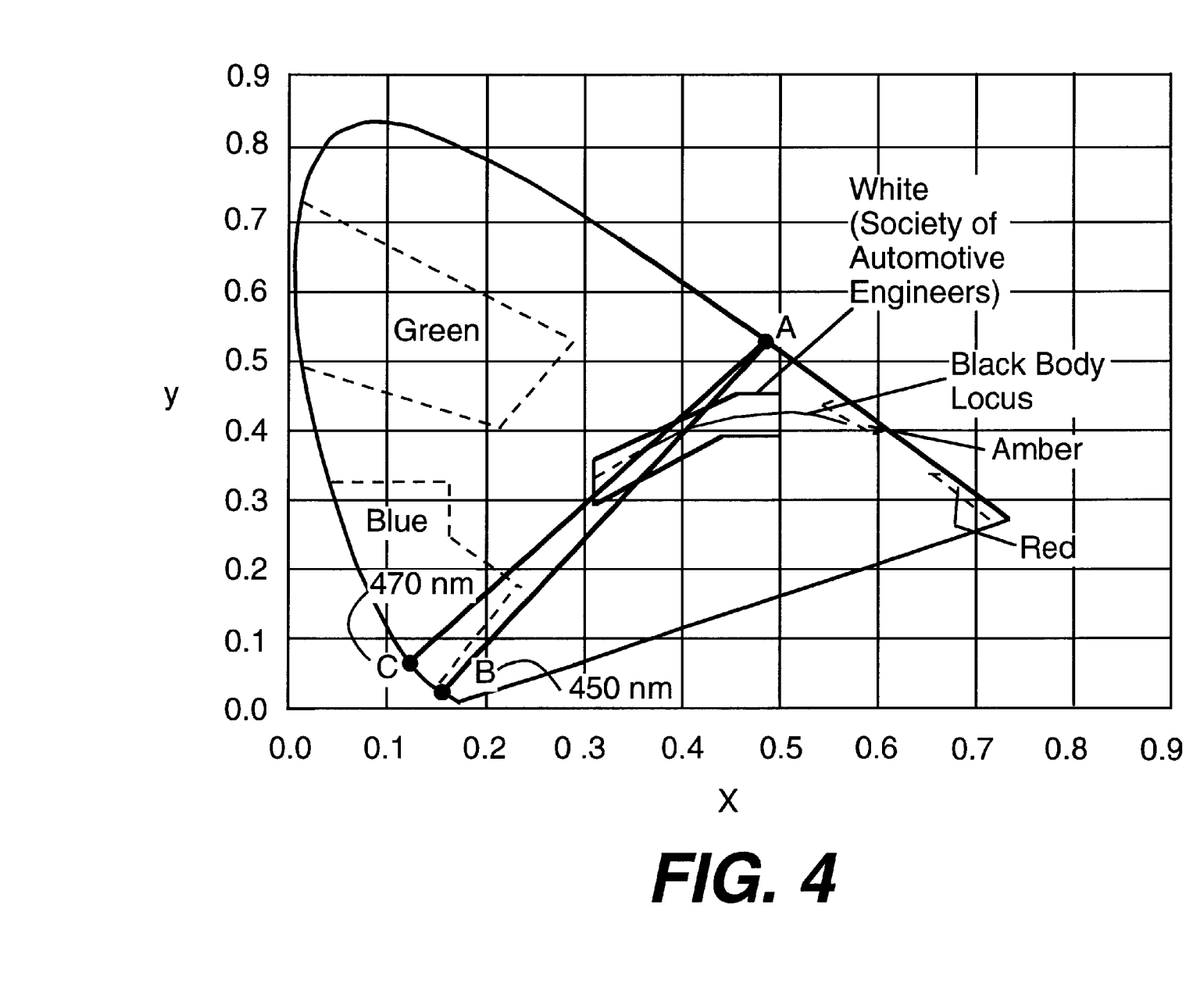
FIG. 4 shows the color coordinates of a range of light sources produced from combinations of UV/blue LEDs and a terbium-containing phosphor of the present invention.

FIG. 4 shows the color coordinates of a range of light sources providing white light that can be produced from various combinations of blue LEDs and a phosphor of the present invention. In FIG. 4, point A represents the coordinate of the peak emission of the $(Tb_{0.97}Ce_{0.03})_3Al_{4.9}O_{12}$ phosphor of the present invention, points B and C represent peak emission of blue LEDs at 450 nm and 470 nm, respectively. Lines AB and AC, which represent the color coordinates of light sources combining a LED and the $(Tb_{0.97}Ce_{0.03})_3Al_{4.9}O_{12}$ phosphor of the present invention, are shown to intersect the Planckian or black body locus. Such intersections represent the color coordinates of white light sources which are combinations of the $(Tb_{0.97}Ce_{0.03})_3Al_{4.9}O_{12}$ phosphor and the appropriate blue LED. Computer simulations of a device that combines 25% contribution of blue light from a blue LED emitting at 470 nm and 75% contribution from the light emitted by the phosphor gives a color temperature of about 4300 K, a luminosity of 315 lumens per watt ("lpw"), and a CRI of 76. Similar computer simulations using 15% contribution from blue light from a blue LED emitting at 450 nm and 85% contribution from the same phosphor gives a white light source having a color temperature of about 3600 K, a luminosity of 342 lpw, and a CRI of 65. More than one phosphors of the present invention may be incorporated in the same device to provide for color adjustment.

A large-area white light source for general illumination may be produced by disposing a plurality of blue LEDs on a flat reflective panel, providing appropriate electrical leads to the individual LEDs, applying a coating comprising at least one phosphor of the present invention and a polymeric binder, such as an epoxy, and then sealing the whole combined structure in a transparent and hermetic seal. The phosphor/polymer coating may be applied directly on the individual LEDs or it may be applied over the entire panel surface. In the former case, an additional polymer coating may be applied over the entire panel surface after the phosphor has been applied on the LEDs. In addition, particles of an inert solid, such as $TiO_2$ or $Al_2O_3$, may be provided in the polymer matrix to enhance the uniformity of the light emission from the device.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A rare earth-activated terbium-containing garnet phosphor having a formula of $(Tb_{1-x-y}A_xRE_y)_aD_zO_{12}$; where A is a member selected from the group consisting of Y, La, Gd, and Sm; RE is a member selected from the group consisting of Ce, Pr, Nd, Sm, Eu, Gd, Dy, Ho, Er, Tm, Yb, Lu, and combinations thereof; D is a member selected from the group consisting of Al, Ga, in, and combinations thereof; a is in a range from about 2.8 to and including 3; x is in a range from 0 to about 0.5; y is in a range from about 0.0005 to about 0.2; 4<z<5; and A is selected such that A is different from RE.

2. The rare earth-activated terbium-containing garnet phosphor according to claim 1, wherein x is in a range from 0 to about 0.3; y is in a range from about 0.005 to about 0.1; and z is in a range from about 4.6 to less than 5.

3. The rare earth-activated terbium-containing garnet phosphor according to claim 1 having a formula of $(Tb_{1-y}Ce_y)_3Al_2O_{12}$ where y is in a range from about 0.0005 to about 0.2, and 4<z<5.

4. The rare earth-activated terbium-containing garnet phosphor according to claim 3 where y is from about 0.005 to about 0.07, and z is from about 4.6 to less than 5.

5. The rare earth-activated terbium-containing garnet phosphor according to claim 3 where y is in a range from about 0.005 to about 0.1, and z is in a range from about 4.6 to less than 5.

6. The rare earth-activated terbium-containing garnet phosphor according to claim 1, wherein said phosphor has a formula of $(Tb_{1-y}Ce_y)_3(Al_{1-r-s}Ga_rIn_s)_zO_{12}$ where y is in a range from about 0.0005 to about 0.2, z is in a range from about 4.6 to less than 5, $0<r\leq0.5$, $0<a<0.5$, and r+s<1.

7. The rare earth-activated terbium-containing garnet phosphor according to claim 1, wherein A is a member selected from the group consisting of Y and Gd, RE is Ce, and D is Al.

8. The rare earth-activated terbium-containing garnet phosphor according to claim 1 wherein x is in a range from 0 to about 0.2; y is in a range from about 0.005 to about 0.07; and z is in a range from about 4.6 to less than 5.

9. A rare earth-activated terbium-containing garnet phosphor, wherein said phosphor has a formula of $(Tb_{1-y}Ce_y)_3(Al_{1-r-s}Ga_rIn_s)_zO_{12}$ where y is in a range from about 0.0005 to about 0.2, z is in a range from about 4 to about 5, $0<r<0.5$, $0<s\leq0.5$, and r+s<1.

10. The rare earth-activated terbium-containing garnet phosphor according to claim 9, wherein y is in a range from about 0.005 to about 0.1; z is in a range from about 4.5 to about 5; r is in a range from about 0.005 to about 0.3; and a is in a range from about 0.005 to about 0.3.

11. The rare earth-activated terbium-containing garnet phosphor according to claim 7, wherein y is from 0.005 to 0.07; z is in a range from about 4.6 to less than about 5; r is in a range from about 0.05 to about 0.2; and a is in a range from about 0.05 to about 0.2.

12. A rare earth-activated terbium-containing garnet phosphor having a formula of $(Tb_{1-y}Ce_y)_3(Al_{1-r-s}Ga_rIn_s)_zO_{12}$ wherein y is in a range from about 0.005 to about 0.1; z is in a range from about 4.5 to 5; r is in a range from about 0.005 to about 0.3; and s is in a range from about 0.005 to about 0.3.

13. A rare earth-activated terbium-containing garnet phosphor activated with cerium, having a formula of $(Tb_{1-y-u-v-w}Ce_yY_uGd_vSm_w)_3Al_zO_{12}$ where y is in a range from about 0.0005 to about 0.2, z is in a range from about 4.6 to less than 5, 0<u, v, w≦0.5, and 0.0005≦y+u+v+w<1.

14. A rare earth-activated terbium-containing garnet phosphor having a formula of $(Tb_{1-y-u-v-w}Ce_yY_uGd_vSm_w)_3Al_zO_{12}$ where y is in a range from about 0.005 to about 0.1; z is in a range from about 4.5 to about 5; each of u, v, and w is in a range from about 0.005 to about 0.3.

15. A method for producing a rare earth-activated terbium-containing garnet phosphor, said method comprising the steps of:

providing amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In;

mixing together the oxygen-containing compounds to form a mixture; and firing the mixture in a reducing atmosphere at a temperature and for a time sufficient to convert the mixture to a rare earth-activated terbium-containing garnet phosphor;

wherein said amounts are chosen such that said rare earth-activated terbium-containing garnet phosphor has a formula of $(Tb_{1-x-y}A_xRE_y)_aD_zO_{12}$; where A is a member selected from the group consisting of Y, La, Gd, and Sm; RE is a member selected from the group consisting of Ce, Pr, Nd, Sm, Eu, Gd, Dy, Ho, Er, Tm, Yb, Lu, and combinations thereof; D is a member selected from the group consisting of Al, Ga, In, and combinations thereof; a is in a range from about 2.8 to and including 3; x is in a range from 0 to about 0.5: y is in a range from about 0.0005 to about 0.2; 4<z<5; and A is selected such that A is different from RE.

16. A method for producing a rare earth-activated terbium-containing garnet phosphor, said method comprising the steps of:

providing amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In;

adding an amount of a fluoride of at least one metal selected from the group consisting of Tb, Al, Ga, In, Y, La, Ga, Sm, Ce, Pr, Nd, Eu, Dy, Ho, Er, Tm, Yb, and Lu to said oxygen-containing compounds, said amount of said fluoride being sufficient to act as a flux for a preparation of said terbium-containing garnet phosphor;

mixing together the oxygen-containing compounds to form a mixture; and firing the mixture in a reducing atmosphere at a temperature and for a time sufficient to convert the mixture to a rare earth-activated terbium-containing garnet phosphor.

17. The method according to claim 16, wherein said oxygen-containing compounds are oxides.

18. The method according claim 16, wherein mixing is carried out by a method selected from the group consisting of stirring, blending, and pulverizing said mixture.

19. The method according to claim 16, wherein said temperature is in a range from about 900° C. to about 1700° C.

20. The method according to claim 19, wherein said temperature is in a range from about 1000° C. to about 1600° C.

21. The method according to claim 16, wherein said time is less than about 10 hours.

22. The method according to claim 16, wherein said reducing atmosphere comprises a gas selected from the group consisting of hydrogen, carbon monoxide, mixtures thereof, and mixture thereof with an inert gas selected from the group consisting of nitrogen, helium, neon, argon, krypton, xenon, and mixtures thereof.

23. The method according to claim 19, wherein said temperature is in a range from about 1200° C. to about 1500° C.

24. A method for producing a rare earth-activated terbium-containing garnet phosphor, said method comprising the steps of:

providing amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In;

mixing together the oxygen-containing compounds to form a mixture;

adding an amount of a fluoride of at least one metal selected from the group consisting of Tb, Al, Ga, In, Y, La, Ga, Sm, Ce, Pr, Nd, Eu, Dy, Ho, Er, Tm, Yb, and Lu to said oxygen-containing compounds while mixing together the oxygen-containing compounds, said amount of said fluoride being sufficient to act as a flux for a preparation of said terbium-containing garnet phosphor; and firing the mixture in a reducing atmosphere at a temperature and for a time sufficient to convert the mixture to a rare earth-activated terbium-containing garnet phosphor.

25. A method for producing a rare earth-activated terbium-containing garnet phosphor, said method comprising the steps of:

providing amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In;

adding an amount of a fluoride of at least one metal selected from the group consisting of Th, Al, Ga, In, Y, La, Ga, Sm, Ce, Pr, Nd, Eu, Dy, Ho, Er, Tm, Yb, and Lu to said oxygen-containing compounds, said amount of said fluoride being sufficient to act as a flux for a preparation of said terbium-containing garnet phosphor;

mixing together the oxygen-containing compounds to form a mixture; and firing the mixture in a reducing atmosphere at a temperature and for a time sufficient to convert the mixture to a rare earth-activated terbium-containing garnet phosphor, wherein said reducing atmosphere comprises a gas generated in a closed container packed with particles of carbon.

26. A method for producing a rare earth-activated terbium-containing garnet phosphor, said method comprising the steps of:

providing amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; arid oxygen-containing compounds of at least one member selected from the group consisting of Al, Ga, and In:

preparing a first solution comprising said oxygen-containing compounds;

providing a second solution comprising a base;

adding said second solution into said first solution to obtain a precipitate;

separating said precipitate;

calcining said precipitate under an oxidizing atmosphere at a temperature and for a time sufficient to dehydrate said precipitate; and firing the mixture in a reducing atmosphere at a temperature and for a time sufficient to convert the mixture to a rare earth-activated terbium-containing garnet phosphor.

27. The method according to claim 26 further comprising adding a fluoride of at least one metal selected from the group consisting of Tb, Al, Ga, In, Y, La, Ga, Sm, Ce, Pr, Nd, Eu, Dy, Ho, Er, Tm, Yb, and Lu into said first solution.

28. The method according to claim 26, wherein said oxygen-containing compounds are selected from the group consisting of nitrate, sulfate, acetates, citrate, chlorates, and combinations thereof.

29. The method according to claim 26, wherein said base is ammonium hydroxide.

30. The method according to claim 26, wherein said calcining is conducted at a temperature in a range from about 400° C. to about 1600° C.

31. The method according to claim 27, wherein said calcining continues for less than about 10 hours.

32. The method according to claim 26, wherein said oxidizing atmosphere is selected from the group consisting of oxygen, air, and mixture thereof with an inert gas selected from the group consisting of nitrogen, helium, neon, argon, krypton, and xenon.

33. The method according to claim 26, wherein said reducing atmosphere comprises a gas selected from the group consisting of hydrogen, carbon monoxide, mixtures thereof, and mixture thereof with an inert gas selected from the group consisting of nitrogen, helium, neon, argon, krypton, xenon, and mixtures thereof.

34. The method according to claim 26, wherein said reducing atmosphere comprises a gas generated in a closed container packed with particles of carbon.

35. The method according to claim 26, wherein said firing is conducted at a temperature in a range from about 900° C. to about 1700° C.

36. The method according to claim 32, wherein said temperature is in a range from about 1000° C. to about 1600° C.

37. The method according to claim 32, wherein said temperature is in a range from about 1200° C. to about 1600° C.

38. A light source emitting white light, said light source comprising:

at least one LED that is capable of emitting a radiation having wavelengths in a range from near UV to blue; and a phosphor casting comprising a transparent material and particles of a rare earth-activated terbium-containing garnet phosphor comprising terbium and at least one element selected from the group consisting of aluminum, gallium, and indium; said phosphor being activated with at least one rare earth metal ion selected from the group consisting of cerium, praseodymium, neodymium, samarium, europium, gadolinium, dysprosium, holmium, erbium, thulium, ytterbium, and lutetium; said phosphor casting substantially surrounding said at least one LED; said phosphor absorbing a portion of said radiation emitted from said at least one LED and emitting light having wavelengths in a visible range;

wherein said rare earth-activated terbium-containing garnet phosphor has a formula of $(Tb_{1-x-y}A_xRE_y)_aD_zO_{12}$; where A is a member selected from the group consisting of Y, La, Gd, and Sm; RE is a member selected from the group consisting of Ce, Pr, Nd, Sm, Eu, Gd, Dy, Ho, Er, Tm, Yb, Lu, and combinations thereof; D is a member selected from the group consisting of Al, Ga, In, and combinations thereof; a is in a range from about 2.8 to and including 3; x is in a range from 0 to about 0.5; y is in a range from about 0.0005 to about 0.2; 4<z<5; and A is selected such that A is different from RE.

39. The light source according to claim 38, wherein said radiation emitted by said at least one LED is in a range from about 315 nm to about 480 nm and said phosphor is capable of emitting light having wavelengths in a range from about 490 nm to about 770 nm.

40. The light source according to claim 39, wherein said LED if emits in a range from about 400 nm to about 480 nm.

41. The light source according to claim 38, wherein said terbium is partially substituted by at least one rare earth metal selected from the group consisting of Y, La, Gd, and Sm.

42. The light source according to claim 38, wherein x is in a range from 0 to about 0.3; y is in a range from about 0.005 to about 0.07; and z is in a range from about 4.6 to less than about 5.

43. The light source according to claim 38, wherein said rare earth-activated terbium-containing garnet phosphor has a formula of $(Tb_{1-y}Ce_y)_3Al_zO_{12}$ where y is in a range from about 0.0005 to about 0.2, and z is in a range from about 4.6 to less than 5.

44. The light source according to claim 43, wherein y is in a range from about 0.005 to about 0.1, and z is in a range from about 4.6 to less than 5.

45. The light source according to claim 38, wherein said rare earth-activated terbium-containing garnet phosphor has a formula of $(Tb_{1-y-u-v-w}Ce_yY_uGd_vSm_w)_3Al_zO_{12}$ where y is in a range from about 0.0005 to about 0.2, z is in a range from about 4.6 to less than 5.0≤u, v, w≤0.5, and 0.0005≤y+u+v+w<1.

46. The light source according to claim 38, wherein A is a member selected from the group consisting of Y and Gd, RE is Ce, and D is Al.

47. The light source according to claim 38, wherein x is in a range from 0 to about 0.2; y is in a range from about 0.005 to about 0.07; and z is in a range from about 4.6 to less than 5.

48. The light source according to claim 43, wherein y is in a range from about 0.005 to about 0.07, and z is in a range from about 4.6 to less than 5.

49. A light source emitting white light, said light source comprising:

at least one LED that is capable of emitting a radiation having wavelengths in a range from near UV to blue; and a phosphor casting comprising a transparent material and particles of a rare earth-activated terbium-containing garnet phosphor comprising terbium and at least one element selected from the group consisting of aluminum, gallium, and indium; said phosphor being activated with cerium; said phosphor casting substantially surrounding said at least one LED; said phosphor absorbing a portion of said radiation emitted from said at least one LED and emitting light having wavelengths in a visible range;

wherein said phosphor has a formula of $(Tb_{1-y}Ce_y)_3(Al_{1-r-a}Ga_rIn_s)_zO_{12}$ where y is in a range from about 0.0005 to about 0.2, z is in a range from about 4 to about 5, $0 \leq r \leq 0.5$, $0 < s \leq 0.5$, and r+s<1.

50. The light source according to claim 49, wherein y is in a range from about 0.005 to about 0.1; z is in a range from about 4.5 to about 5; r is in a range from about 0.005 to about 0.3; and a is in a range from about 0.005 to about 0.3.

51. The light source according to claim 49, wherein y is in a range from about 0.005 to about 0.07; z is in a range from about 4.6 to less than about 5; r is in a range from about 0.05 to about 0.2; and s is in a range from about 0.05 to about 0.2.

52. A light source emitting white light, said light source comprising:
at least one LED that is capable of emitting a radiation having wavelengths in a range from near UV to blue; and
a phosphor casting comprising a transparent material and particles of a rare earth-activated terbium-containing garnet phosphor comprising terbium and at least one element selected from the group consisting of aluminum, gallium, and indium; said phosphor being activated with cerium; said phosphor casting substantially surrounding said at least one LED; said phosphor absorbing a portion of said radiation emitted from said at least one LED and emitting light having wavelengths in a visible range;

wherein said phosphor has a formula of $(Tb_{1-y}Ce_y)_3(Al_{1-r-a}Ga_rIn_s)_zO_{12}$ where y is in a range from about 0.0005 to about 0.2, z is in a range from about 4.6 to less than 5, $0 < r \leq 0.5$, $0 \leq s \leq 0.5$, and r+s<1.

53. The light source according to claim 52, wherein said y is in a range from about 0.005 to about 0.1; r is in a range from about 0.005 to about 0.3; and s is in a range from about 0.005 to about 0.3.

54. The light source according to claim 53, wherein said y is in a range from about 0.005 to 0.07; z is in a range from about 4.6 to less than about 5; r is in a range from about 0.05 to about 0.2; and s is in a range from about 0.05 to about 0.2.

55. A light source emitting white light said light source comprising:
at least one LED that is capable of emitting a radiation having wavelengths in a range from near UV to blue; and
a phosphor casting comprising a transparent material and particles of a rare earth-activated terbium-containing garnet phosphor comprising terbium and at least one element selected from the group consisting of aluminum, gallium, and indium; said phosphor being activated with cerium; said phosphor casting substantially surrounding said at least one LED; said phosphor absorbing a portion of said radiation emitted from said at least one LED and emitting light having wavelengths in a visible range;

wherein said rare earth-activated terbium-containing garnet phosphor has a formula of $(Tb_{1-y-u-v-w}Ce_yY_uGd_vSm_w)_3Al_zO_{12}$ where y is in a range from about 0.005 to about 0.1; z is in a range from about 4.5 to about 5; each of u, v, and w is in a range from about 0.005 to about 0.3; and $0.0005 \leq y+u+v+w<1$.

56. A light source emitting white light, said light source comprising:
at least one LED that is capable of emitting a radiation having wavelengths in a range from near UV to blue; and
a coating comprising a transparent material and particles of a rare earth-activated terbium-containing garnet phosphor comprising terbium and at least one element selected from the group consisting of aluminum, gallium, and Indium; said phosphor being activated with at least one rare earth metal ion selected from the group consisting of cerium, praseodymium, neodymium, samarium, europium, gadolinium, dysprosium, holmium, erbium, thulium, ytterbium, and lutetium; said coating being disposed adjacent to said at least one LED; said phosphor absorbing a portion of said radiation emitted from said at least one LED and emitting light having wavelengths in a visible range;

wherein said rare earth-activated terbium-containing garnet phosphor has a formula of $(Tb_{1-x-y}A_xRE_y)_aD_zO_{12}$; where A is a member selected from the group consisting of Y, La, Gd, and Sm; RE is a member selected from the group consisting of Ce, Pr, Nd, Sm, Eu, Gd, Dy, Ho, Er, Tm, Yb, Lu, and combinations thereof; D is a member selected from the group consisting of Al, Ga, In, and combinations thereof; a is in a range from about 2.8 to and including 3; x is in a range from 0 to about 0.5; y is in a range from about 0.0005 to about 0.2; 4<z<5; and A is different from RE.

57. The light source according to claim 56 wherein said radiation emitted by said at least one LED is in a range from about 315 nm to about 480 nm and said phosphor is capable of emitting light having wavelengths in a range from about 490 nm to about 770 nm.

58. The light source according to claim 57, wherein said LED preferably emits in a range from about 400 nm to about 480 nm.

59. The light source according to claim 56, wherein said terbium is partially substituted by at least one rare earth metal selected from the group consisting of Y, La, Gd, and Sm.

60. The light source according to claim 56, wherein x is in a range from 0 to about 0.3; y is in a range from about 0.005 to about 0.1; and z is in a range from about 4.6 to less than 5.

61. The light source according to claim 56, wherein said rare earth-activated terbium-containing garnet phosphor has a formula of $(Tb_{1-y}Ce_y)_3Al_zO_{12}$ where y is in a range from about 0.0005 to about 0.2 and z is a range from about 4.6 to less than 5.

62. The light source according to claim 56, wherein said rare earth-activated terbium-containing garnet phosphor has a formula $(Tb_{1-y-u-v-w}Ce_yY_uGd_vSm_w)_3Al_zO_{12}$ where y is in a range from about 0.0005 to about 0.2, z is in a range from about 4.6 to less than 5, $0 \leq u, v, w \leq 0.5$, and $0.0005 \leq y+u+v+w<1$.

63. The light source according to claim 56, wherein A is a member selected from the group consisting of Y and Gd, RE is Ce, and D is Al.

64. The light source according to claim 56, wherein x is in a range from 0 to about 0.2; y is in a range from about 0.005 to about 0.07; and z is in a range from about 4.6 to less than 5.

65. A light source emitting white light, said light source comprising:
at least one LED that is capable of emitting a radiation having wavelengths in a range from near UV to blue; and a coating comprising a transparent material and particles of a rare earth-activated terbium-containing garnet phosphor having a formula of $(Tb_{1-y}Ce_y)_3Al_zO_{12}$ where y is in a range from about 0.005 about 0.1 and z is a range from about 4.6 to less than about 5; said coating being disposed adjacent to said at least one LED; said phosphor absorbing a portion of said radiation emitted from said at least one LED and emitting a light having wavelengths in a visible range.

66. A light source emitting white light, said light source comprising:
at least one LED that is capable of emitting a radiation having wavelengths in a range from near UV to blue; and
a coating comprising a transparent material and particles of a rare earth-activated terbium-containing garnet phosphor comprising terbium and at least one element selected from the group consisting of aluminum, gallium, and indium; said phosphor being activated with cerium; said coating being disposed adjacent to said at least one LED; said phosphor absorbing a portion of said radiation emitted from said at least one LED and emitting light having wavelength in a visible range;
wherein said phosphor has a formula of $(Tb_{1-y}Ce_y)_3Al_{1-r-s}Ga_rIn_s)_zO_{12}$ where y is in a range from about 0.0005 to about 0.2, z is in a range from about 4 to about 5, $0 \leq r \leq 0.5$, $0 < s \leq 0.5$, and r+s<1.

67. The light source according to claim 66, wherein y is in a range from about 0.005 to about 0.1; z is in a range from about 4.5 to about 5; r is in a range from about 0.005 to about 0.3; and s is in a range from about 0.005 to about 0.3.

68. The light source according to claim 66, wherein y is in a range from about 0.005 to about 0.07: z is in a range from about 4.6 to less than about 5; r is in a range from about 0.05 to about 0.2; and s is in a range from about 0.05 to about 0.2.

69. A light source emitting white light, said light source comprising:
at least one LED that is capable of emitting a radiation having wavelengths in a range from near UV to blue; and
a coating comprising a transparent material and particles of a rare earth-activated terbium-containing garnet phosphor comprising terbium and at least one element selected from the group consisting of aluminum, gallium, and indium; said phosphor being activated with cerium; said coating being disposed adjacent to said at least one LED; said phosphor absorbing a portion of said radiation emitted from said at least one LED and emitting light having wavelengths in a visible range;
wherein said phosphor has a formula of $(Tb_{1-y}Ce_y)_3Al_{1-r-s}Ga_rIn_s)_zO_{12}$ where y is in a range from about 0.0005 to about 0.2, z is in a range from about 4.6 to less than about 5, $0 < r \leq 0.5$, $0 \leq s \leq 0.5$, and r+s<1.

70. A light source emitting white light, said light source comprising:
at least one LED that is capable of emitting a radiation having wavelengths in a range from near UV to blue; and
a coating comprising a transparent material and particles of a rare earth-activated terbium-containing garnet phosphor comprising terbium and at least one element selected from the group consisting of aluminum, gallium, and indium; said phosphor being activated with cerium; said coating being disposed adjacent to said at least one LED; said phosphor absorbing a portion of said radiation emitted from said at least one LED and emitting light having wavelengths in a visible range;
wherein said phosphor has a formula of $(Tb_{1-y}Ce_y)_3(Al_{1-r-s}Ga_rIn_s)_zO_{12}$ where y is in a range from about 0.005 to about 0.1; z is in a range from about 4.5 to about 5; r is in a range from about 0.005 to about 0.3; and s is in a range from about 0.005 to about 0.3.

71. A light source emitting white light said light source comprising:
at least one LED that is capable of emitting a radiation having wavelengths in a range from near UV to blue; and
a coating comprising a transparent material and particles of a rare earth-activated terbium-containing garnet phosphor comprising terbium and at least one element selected from the group consisting of aluminum, gallium, and indium; said phosphor being activated with cerium; said coating being disposed adjacent to said at least one LED; said phosphor absorbing a portion of said radiation emitted from said at least one LED and emitting light having wavelengths in a visible range;
wherein said phosphor has a formula of $(Tb_{1-y}Ce_y)_3(Al_{1-r-s}Ga_rIn_s)_zO_{12}$ where y is in a range from about 0.0005 to about 0.1; z is in a range from about 4.5 to about 5; and each of u, v, and w is in a range from about 0.005 to about 0.3.

72. A rare earth-activated terbium-containing garnet phosphor having a formula of $(Tb_{1-y}Ce_y)_aAl_{4.9}O_{12}$, wherein y is in a range from about 0.0005 to about 0.2, and a is in a range from about 2.8 to 3.

73. A cerium-activated terbium-containing garnet phosphor having a formula of $Tb_aAl_zO_{12}:Ce^{3+}$, wherein a ratio of a/z is 0.594 and z is 4.9.

74. A cerium-activated terbium-containing garnet phosphor having a formula of $Tb_aAl_zO_{12}:Ce^{3+}$, wherein a ratio of a/z is 0.582 and z is 5.

75. A cerium-activated terbium-containing garnet phosphor having a formula of $Tb_aAl_zO_{12}:Ce^{3+}$, wherein a ratio of a/z is 0.613 and z is 4.75.

76. A rare earth-activated terbium-containing garnet phosphor having a formula of $(Tb_{1-y}Ce_y)_3(Al_{1-r-s}Ga_rIn_s)_zO_{12}$ wherein y is in a range from 0.005 to 0.07; z is in a range from about 4.5 to about 5; r is in a range from about 0.05 to about 0.2; and s is in a range from about 0.05 to about 0.2.

77. A rare earth-activated terbium-containing garnet phosphor having a formula of $(Tb_{1-y-u-v-w}Ce_yY_uGd_vSm_w)_3Al_zO_{12}$ where y is in a range from about 0.005 to about 0.07; z is in a range from about 4.6 to less than about 5; each of u, v, and w is in a range from about 0.005 to about 0.1.

78. A light source emitting white light, said light source comprising:
at least one LED that is capable of emitting a radiation having wavelengths in a range from near UV to blue; and
a coating comprising a transparent material and particles of a rare earth-activated terbium-containing garnet phosphor having a formula of $(Tb_{1-y}Ce_y)_3Al_zO_{12}$ where y is in a range from about 0.005 to about 0.07 and z is a range from about 4.6 to less than about 5 said coating being disposed adjacent to said at least one LED: said phosphor absorbing a portion of said radiation emitted from said at least one LED and emitting light having wavelengths in a visible range.

79. A light source emitting white light, said light source comprising:

at least one LED that is capable of emitting a radiation having wavelengths in a range from near UV to blue; and a coating comprising a transparent material and particles of a rare earth-activated terbium-containing garnet phosphor comprising terbium and at least one element selected from the group consisting of aluminum, gallium, and indium; said phosphor being activated with cerium; said coating being disposed adjacent to said at least one LED; said phosphor absorbing a portion of said radiation emitted from said at least one LED and emitting light having wavelengths in a visible range;

wherein said phosphor has a formula of $(Tb_{1-y}Ce_y)_3(Al_{1-y}Ga_rIn_s)_zO_{12}$ where y is in a range from about 0.005 to about 0.07, z is in a range from about 4.6 to less than about 5, r is in a range from about 0.05 to about 0.2; and s is in a range from about 0.05 to about 0.2.

80. A light source emitting white light, said light source comprising:

at least one LED that is capable of emitting a radiation having wavelengths in a range from near UV to blue; and a coating comprising a transparent material and particles of a rare earth-activated terbium-containing garnet phosphor comprising terbium and at least one element selected from the group consisting of aluminum, gallium, and indium; said phosphor being activated with cerium; said coating being disposed adjacent to said at least one LED; said phosphor absorbing a portion of said radiation emitted from said at least one LED and emitting light having wavelengths in a visible range;

wherein said phosphor has a formula of $(Tb_{1-y-u-v-w}Ce_yY_uGd_vSm_w)_3Al_zO_{12}$ where y is in a range from about 0.005 to about 0.07; z is in a range from about 4.6 to less than about 5; each of u, v, and w is in a range from about 0.005 to about 0.1; and $0.005 \leq y+u+v+w \leq 1$.

* * * * *

UNITED STATES PATENT AND TRADEMARK OFFICE
CERTIFICATE OF CORRECTION

PATENT NO. : 6,596,195 B2  Page 1 of 1
DATED : July 22, 2003
INVENTOR(S) : Srivastava et al.

It is certified that error appears in the above-identified patent and that said Letters Patent is hereby corrected as shown below:

Column 8,
Line 11, cancel "in" and substitute -- In --.
Lines 21 and 22, cancel the formula and substitute the following formula:
-- $(Tb_{1-y}Ce_y)3Al_z)_{12}$ --.
Line 53, cancel "a is in a range from about 0.005 to about 0.3" and substitute -- s is in a range from about 0.005 to about 0.3 --.
Line 57-58, cancel "a is in a range from about 0.005 to about 0.2" and substitute -- s is in a range from about 0.005 to about 0.2 --.

Signed and Sealed this

Eighteenth Day of May, 2004

JON W. DUDAS
*Acting Director of the United States Patent and Trademark Office*